(12) United States Patent
Lin et al.

(10) Patent No.: US 10,403,744 B2
(45) Date of Patent: Sep. 3, 2019

(54) SEMICONDUCTOR DEVICES COMPRISING 2D-MATERIALS AND METHODS OF MANUFACTURE THEREOF

(71) Applicants: National Taiwan University, Taipei (TW); Taiwan Semiconductor Manufacturing Company, Ltd., Hsin-Chu (TW)

(72) Inventors: Shih-Yen Lin, Hsin-Chu (TW); Samuel C. Pan, Hsin-Chu (TW); Chong-Rong Wu, Hsin-Chu (TW); Xian-Rui Chang, Hsin-Chu (TW)

(73) Assignees: Taiwan Semiconductor Manufacturing Company, Ltd., Hsin-Chu (TW); National Taiwan University, Taipei (TW)

( * ) Notice: Subject to any disclaimer, the term of this patent is extended or adjusted under 35 U.S.C. 154(b) by 119 days.

(21) Appl. No.: 14/753,851

(22) Filed: Jun. 29, 2015

(65) Prior Publication Data

US 2016/0379901 A1 Dec. 29, 2016

(51) Int. Cl.
*H01L 21/786* (2006.01)
*H01L 29/778* (2006.01)
(Continued)

(52) U.S. Cl.
CPC ............ *H01L 29/778* (2013.01); *C30B 25/16* (2013.01); *C30B 29/46* (2013.01); *C30B 29/60* (2013.01); *H01L 21/0242* (2013.01); *H01L 21/0262* (2013.01); *H01L 21/02485* (2013.01); *H01L 21/02499* (2013.01); *H01L 21/02505* (2013.01);
(Continued)

(58) Field of Classification Search
None
See application file for complete search history.

(56) References Cited

U.S. PATENT DOCUMENTS 6,204,204 B1 * 3/2001 Paranjpe ............... C23C 16/34
257/E21.17
7,667,271 B2 2/2010 Yu et al.
(Continued)

FOREIGN PATENT DOCUMENTS

KR 20030021023 A 3/2003
KR 20060113841 A 11/2006
WO 2005031845 A1 4/2005

OTHER PUBLICATIONS

Choudhary et al., "Growth of Large-Scale and Thickness-Modulated MoS2 Nanosheets," ACS Appl. Mater. Interfaces 2014, 6, pp. 21215-21222.
(Continued)

*Primary Examiner* — Ali Naraghi
(74) *Attorney, Agent, or Firm* — Slater Matsil, LLP

(57) ABSTRACT

A method for manufacturing a semiconductor device comprising two-dimensional (2D) materials may include: epitaxially forming a first two-dimensional (2D) material layer over a substrate; calculating a mean thickness of the first 2D material layer; comparing the mean thickness of the first 2D material layer with a reference parameter; determining that the mean thickness of the first 2D material layer is not substantially equal to the reference parameter; and after the determining, epitaxially forming a second 2D material layer over the first 2D material layer.

20 Claims, 19 Drawing Sheets

(51) Int. Cl.
*H01L 21/02* (2006.01)
*C30B 25/16* (2006.01)
*C30B 29/46* (2006.01)
*H01L 21/66* (2006.01)
*C30B 29/60* (2006.01)

(52) U.S. Cl.
CPC ........ *H01L 21/02568* (2013.01); *H01L 22/12* (2013.01); *H01L 22/20* (2013.01)

(56) References Cited

U.S. PATENT DOCUMENTS

| | | | |
|---|---|---|---|
| 7,910,453 B2 | 3/2011 | Xu et al. | |
| 8,329,138 B2* | 12/2012 | Tenne | B82Y 30/00 423/509 |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 2003/0022528 A1* | 1/2003 | Todd | B82Y 10/00 438/341 |
| 2014/0001574 A1 | 1/2014 | Chen et al. | |
| 2014/0110755 A1 | 4/2014 | Colinge | |
| 2014/0151812 A1 | 6/2014 | Liaw | |
| 2015/0283482 A1* | 10/2015 | Hersam | B82Y 40/00 494/37 |
| 2015/0318401 A1* | 11/2015 | Duan | H01L 29/66742 250/200 |
| 2016/0233322 A1* | 8/2016 | Yeh | H01L 29/66969 |

OTHER PUBLICATIONS

Yoon et al., "Calculations of Thickness Uniformity in Molecular Beam Epitaxial Growth," The Institute of Electronics Engineers of Korea—A 30(8), Aug. 1993, pp. 671-677.

* cited by examiner

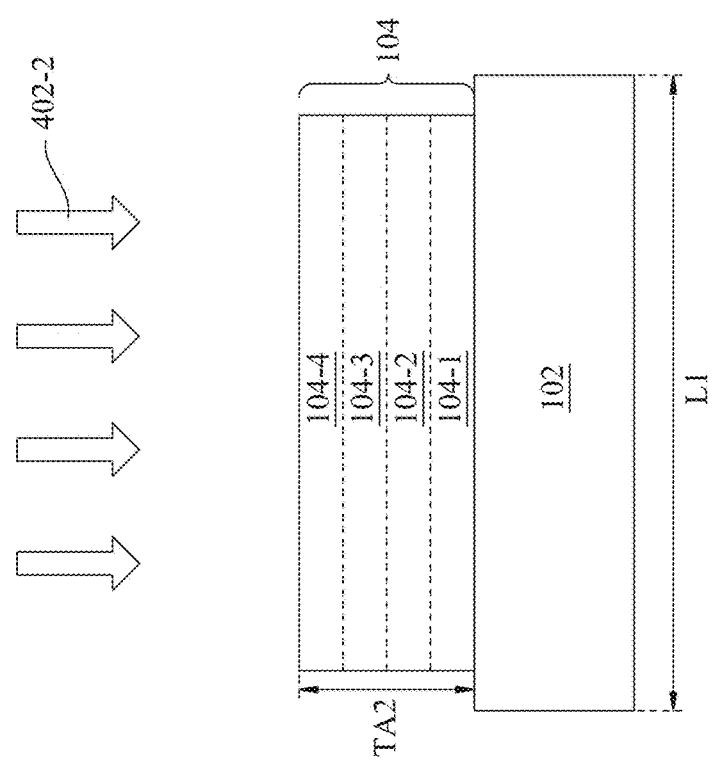

SEMICONDUCTOR DEVICES COMPRISING 2D-MATERIALS AND METHODS OF MANUFACTURE THEREOF

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A to 4L show a process flow illustrating some of the steps of the method shown in FIGS. 3A and 3B, in accordance with some embodiments.

DETAILED DESCRIPTION

Figure 1:
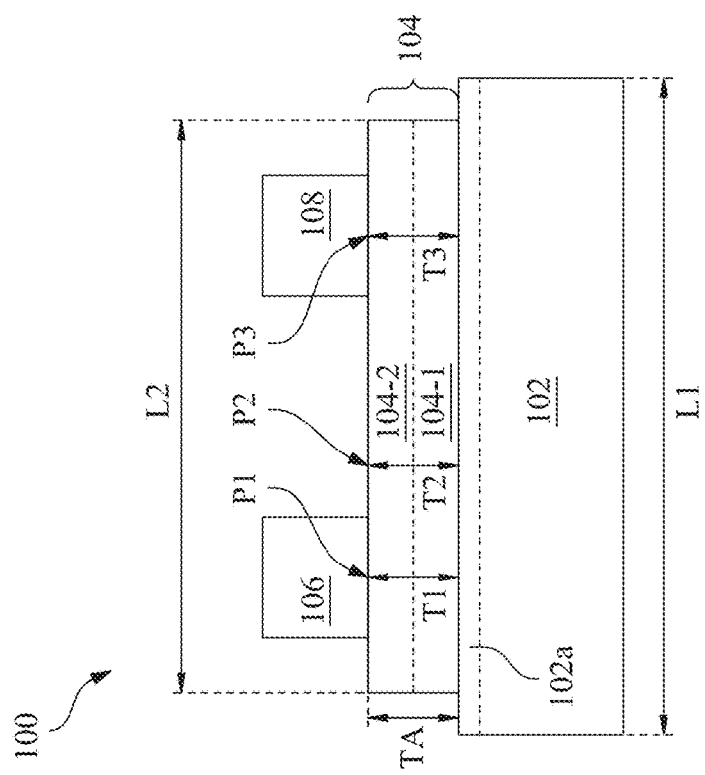
FIG. 1 shows a cross-sectional view of a semiconductor device, in accordance with some embodiments.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a recent development of the FET, a channel region of the FET may be formed in a two dimensional (2D) material layer, which may provide the FET with improved performance (e.g. relative to FETs that are devoid of a 2D material layer). For example, photo-transistors having a channel layer formed in a 2D material layer exhibit high sensitivity to light compared to photo-transistors that have a channel layer formed in a typical semiconductor material, such as silicon, germanium, combinations thereof, or the like. Improved methods of forming 2D material layers for semiconductor devices may be needed.

FIG. 1 shows a cross-sectional view of a semiconductor device 100, in accordance with one or more embodiments. The semiconductor device 100 may, as an example, be a transistor (e.g. a field effect transistor) having two or more layers of two dimensional (2D) materials. The semiconductor device 100 may include a carrier substrate 102, which may have a first lateral dimension L1. The carrier substrate 102 may function to provide mechanical and/or structure support for features or structures of the semiconductor device 100. The carrier substrate 102 may be a semiconductor substrate. For example, the carrier substrate 102 may comprise sapphire (e.g. crystalline $Al_2O_3$), e.g. a large grain or a single crystalline layer of sapphire or a coating of sapphire. As another example, the carrier substrate 102 may be a sapphire substrate, e.g. a transparent sapphire substrate comprising, as an example, $\alpha\text{-}Al_2O_3$. As yet another example, the carrier substrate 102 may comprise an elementary semiconductor (e.g. including silicon and/or germanium in crystal), a compound semiconductor (e.g. including at least one of oxide, silicon nitride, silicon carbide, gallium arsenic, gallium phosphide, indium phosphide, indium arsenide, or indium antimonide), an alloy semiconductor (e.g. including at least one of Cu, Al, AlCu, W, Ti, SiGe, GaAsP, AlInAs, AlGaAs, GaInAs, GaInP, or GaInAsP), or combinations thereof. In some embodiments where the carrier substrate 102 is a semiconductor substrate, a topmost layer 102a of the carrier substrate 102 may, as an example, be an oxide of the semiconductor material of the carrier substrate 102. For example, in an embodiment, the carrier substrate 102 may be a silicon substrate and the topmost layer 102a of the carrier substrate 102 may comprise an oxide of silicon (e.g. silicon dioxide).

FIG. 1 shows a first conductive layer 104 formed over the carrier substrate 102. The first conductive layer 104 may be formed directly on the carrier substrate 102 such that the first conductive layer 104 and the carrier substrate 102 are in contact (e.g. physical contact) with each other. The first conductive layer 104 may comprise a plurality of 2D material sub-layers 104-1, 104-2 (e.g. two or more 2D material sub-layers). In other words, the first conductive layer 104 may be a multi-layer 2D material structure of the semiconductor device 100. In the example shown in FIG. 1, two 2D material sub-layers are shown (e.g. comprising a first 2D material sub-layer 104-1 and a second 2D material sub-layer 104-2). However, in another embodiment, the number of 2D material sub-layers of the first conductive layer 104 may be more than two (e.g. four, six, eight, or more 2D material sub-layers). Each of the 2D material sub-layers 104-1, 104-2 may comprise a 2D material having a non-zero bandgap. As an example, each of the 2D material sub-layers 104-1, 104-2 of the first conductive layer 104 may comprise a transition metal dichalcogenide (TMD) material. A TMD material may comprise a compound of a transition metal and a group VIA element. The transition metal may include tungsten (W), molybdenum (Mo), titanium (Ti), or the like, while the group VIA element may comprise sulfur (S), selenium (Se), tellurium (Te), or the like. For example, the first 2D material sub-layer 104-1 of the first conductive layer 104 may comprise $MoS_2$, $MoSe_2$, $WS_2$, $WSe_2$, combinations thereof, or the like. The second 2D material sub-layer 104-2 of the first conductive layer 104 may also comprise $MoS_2$, $MoSe_2$, $WS_2$, $WSe_2$, combinations thereof, or the like.

Figure 2:
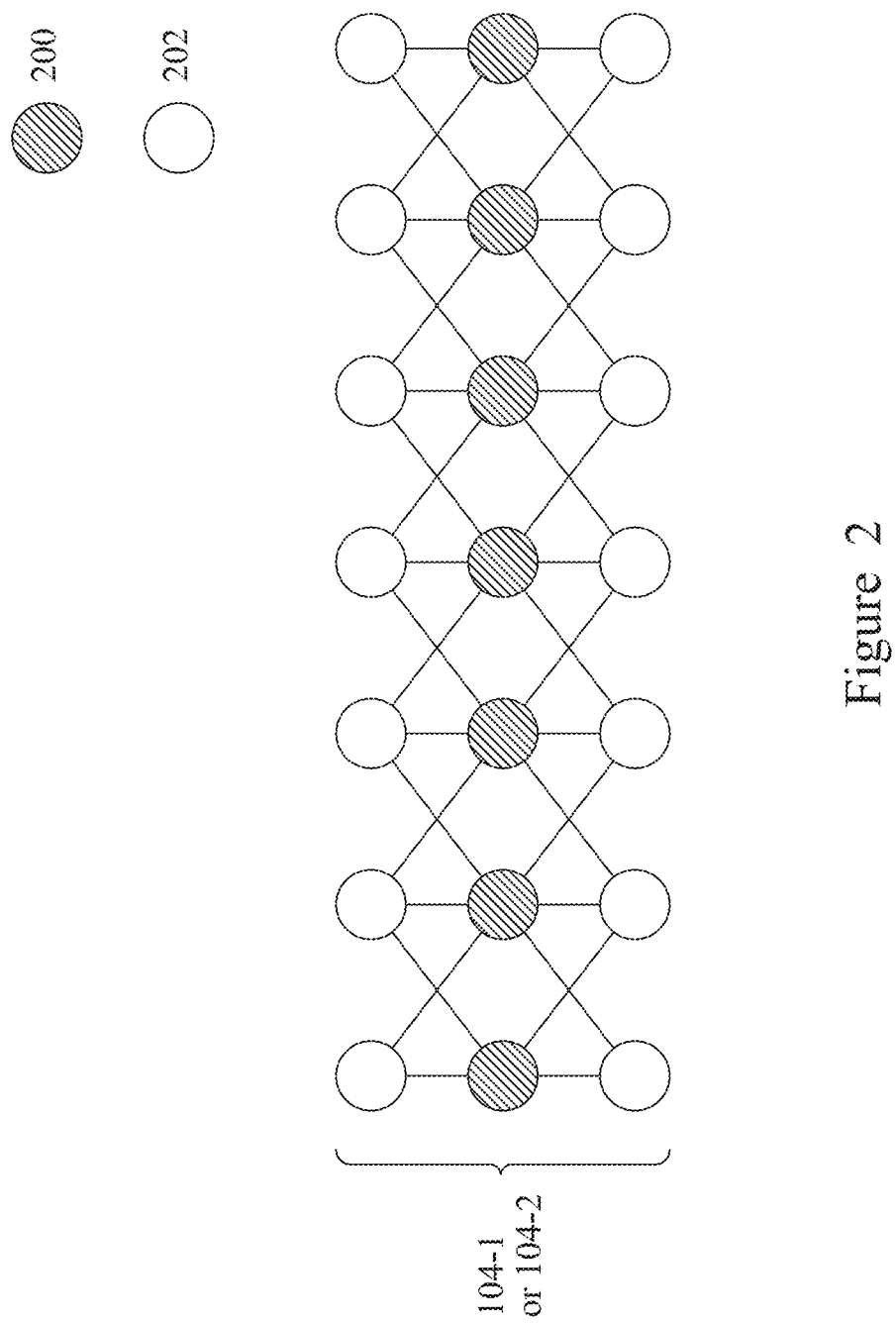
FIG. 2 shows a schematic representation of a one-molecule thick transition metal dichalcogenide (TMD) layer, in accordance with some embodiments.

FIG. 2 illustrates a schematic representation of one of the 2D material sub-layers 104-1, 104-2 of the first conductive layer 104, in accordance with one or more embodiments. As shown in FIG. 2, the 2D material sub-layer may comprise a one-molecule thick TMD material layer in accordance with some exemplary embodiments. As an example, the first 2D material sub-layer 104-1 may have a bonding structure similar to the schematic representation shown in FIG. 2. In like manner, the second 2D material sub-layer 104-2 may have a bonding structure similar to the schematic representation shown in FIG. 2. As shown in FIG. 2, the one-molecule thick TMD material layer comprises transition metal atoms 200 and group VIA atoms 202. The transition metal atoms 200 may form a layer in a middle region of the one-molecule thick TMD material layer, and the group VIA atoms 202 may form a first layer over the layer of transition metal atoms 200, and a second layer underlying the layer of transition metal atoms 200. The transition metal atoms 200 may be W atoms, Mo atoms, or Ti atoms, while the group VIA atoms 202 may be S atoms, Se atoms, or Te atoms. In the example of FIG. 2, each of the transition metal atoms 200 is bonded (e.g. by covalent bonds) to six group VIA atoms 202, and each of the group VIA atoms 202 is bonded (e.g. by covalent bonds) to three transition metal atoms 200.

In an example where the first 2D material sub-layer 104-1 of the first conductive layer 104 comprises $MoS_2$, the first 2D material sub-layer 104-1 may, by itself (e.g. in an absence of the second 2D material sub-layer 104-2), be a direct bandgap material layer having a bandgap of about 1.8 eV, as an example. In like manner, in an example where the second 2D material sub-layer 104-2 of the first conductive layer 104 comprises $MoS_2$, the second 2D material sub-layer 104-2 may, by itself (e.g. in an absence of the first 2D material sub-layer 104-1), be a direct bandgap material layer having a bandgap of about 1.8 eV, as an example. However, when the second 2D material sub-layer 104-2 is disposed over the first 2D material sub-layer 104-1 to form the multi-layer 2D material structure of the first conductive layer 104 (as in the example of FIG. 1), an interlayer bond may formed (e.g. by van der Waals forces) between the first 2D material sub-layer 104-1 and the second 2D material sub-layer 104-2. This may cause the first conductive layer 104, comprising the first 2D material sub-layer 104-1 and the second 2D material sub-layer 104-2, to have an indirect bandgap of about 1.29 eV.

Referring back to FIG. 1, the semiconductor device 100 may include a source contact 106 and a drain contact 108 formed over the first conductive layer 104. The source contact 106 and the drain contact 108 may be laterally separated from each other, as shown in FIG. 1. The source contact 106 and the drain contact 108 may comprise copper, aluminum, palladium, silver, nickel, gold, titanium, gadolinium, alloys thereof, or the like.

The semiconductor device 100 may be a transistor (e.g. a field effect transistor) having a multi-layer 2D material structure (e.g. the first conductive layer 104 comprising the plurality of 2D material sub-layers 104-1, 104-2). In operation, a channel may be formed in the first conductive layer 104, e.g. in response to voltages supplied to or applied by the source contact 106 and the drain contact 108. As an example, the channel may be formed in a portion of the first conductive layer 104 between the source contact 106 and the drain contact 108. As described above, the first conductive layer 104 may have a non-zero bandgap. This feature of the semiconductor device 100 may allow the semiconductor device 100 to have a higher On/Off ratio compared to another semiconductor device that may operate by having a channel formed in at least a portion of a 2D material layer having a zero bandgap (e.g. graphene).

The mobility of carriers in the first conductive layer 104 may depend, at least in part, on a mean thickness TA of the first conductive layer 104. As shown in FIG. 1, the first conductive layer 104 may have a second lateral dimension L2. The mean thickness TA of the first conductive layer 104 may, as an example, be the mean thickness of the first conductive layer 104 measured along the second lateral dimension L2. Illustratively, the first conductive layer 104 may have a first local thickness T1 at a first point P1 along the second lateral dimension L2, a second local thickness T2 at a second point P2 along the second lateral dimension L2, and a third local thickness T3 at a third point P3 along the second lateral dimension L2. In such an example, the mean thickness TA may be a mean of the first local thickness T1, the second local thickness T2, and the third local thickness T3.

As described above, the mean thickness TA of the first conductive layer 104 may be correlated with the mobility of carriers in the first conductive layer 104. Consequently, increasing the mean thickness TA of the first conductive layer 104 may increase the mobility of carriers in the first conductive layer 104 (also see description below in relation to FIG. 7). Since the first conductive layer 104 is a multi-layer 2D material structure, the mean thickness TA of the first conductive layer 104 (and hence the mobility of carriers in the first conductive layer 104) may be increased by increasing the number of 2D material sub-layers. As an example, in the embodiment of FIG. 1 where two 2D material sub-layers 104-1 and 104-2 are shown, the mean thickness TA of the first conductive layer 104 may be in a range from about 0.6 nm to about 1.6 nm (e.g. about 1.4 nm). As another example, in an embodiment where the first conductive layer 104 comprises four 2D material sub-layers (e.g. as described below in relation to FIG. 4C), the mean thickness TA of the first conductive layer 104 may be in a range from about 1.2 nm to about 3.2 nm (e.g. about 2.5 nm), and the mobility of carriers in the first conductive layer 104 comprising four 2D material sub-layers may be greater than the mobility of carriers in the first conductive layer 104 comprising two 2D material sub-layers. As yet another example, in an embodiment where the first conductive layer 104 comprises six 2D material sub-layers (e.g. as described below in relation to FIG. 4E), the mean thickness TA of the first conductive layer 104 may be in a range from about 1.8 nm to about 4.8 nm (e.g. about 3.7 nm), and the mobility of carriers in the first conductive layer 104 comprising six 2D material sub-layers may be greater than the mobility of carriers in the first conductive layer 104 comprising four 2D material sub-layers.

In manufacturing the semiconductor device 100, it may be desirable to have a method of manufacturing the first conductive layer 104 that can control the mobility of carriers in the first conductive layer 104 by tracking and/or controlling the number of 2D material sub-layers formed in the first conductive layer 104. For example, such a method may be capable of providing feedback regarding the number of 2D material sub-layers in the first conductive layer 104, and if desired, more 2D material sub-layers may be subsequently formed thereby increasing the mean thickness TA of the first conductive layer 104. Since the mean thickness TA of the first conductive layer 104 may be correlated with the mobility of carriers in the first conductive layer 104, such a method may be capable of controlling the mobility of carriers in the first conductive layer 104.

It may also be desirable that such a method of manufacturing the semiconductor device 100 be capable of forming the first conductive layer 104 such that it is free from voids and such that it has a substantially uniform thickness along the second lateral dimension L2. For example, such a method may be capable of forming the first conductive layer 104 such that the local thicknesses T1, T2, T3 are substantially equal or have a small standard deviation about the mean thickness TA.

Figure 3A:
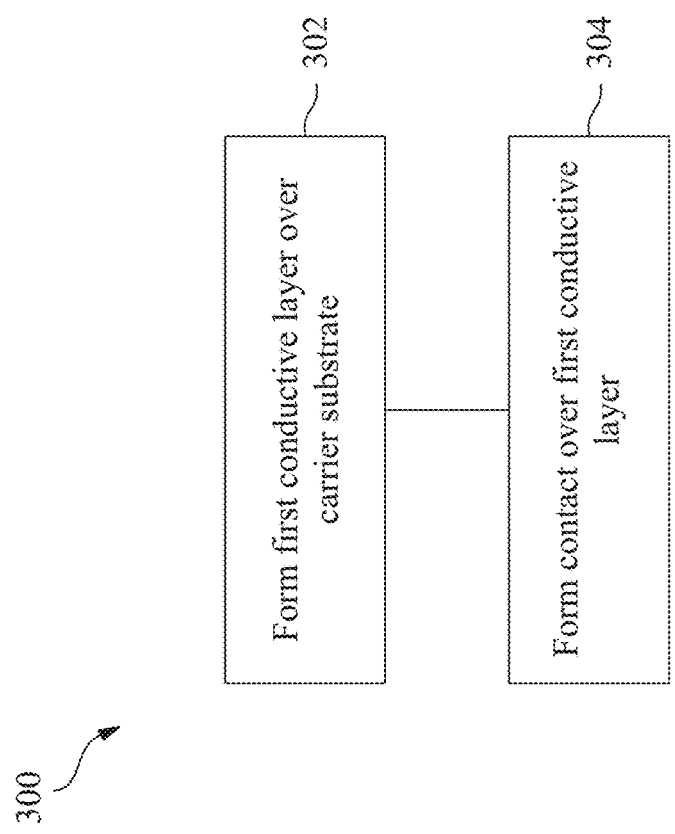
FIG. 3A shows some of the steps of a method of manufacturing a semiconductor device, in accordance with some embodiments.

FIG. 3A shows some of the steps of a method 300 of manufacturing the semiconductor device 100, in accordance with one or more embodiments. The method 300 may, as an example, be capable of controlling the mobility of carriers in the first conductive layer 104 by tracking and/or controlling the number of 2D material sub-layers formed in the first conductive layer 104. The method 300 may also, as an example, be capable of forming the first conductive layer 104 such that it is free from voids and such that it has a substantially uniform thickness along the second lateral dimension L2. As shown in FIG. 3A, the method 300 may include a step 302 where the first conductive layer 104 is formed over the carrier substrate 102. The method 300 may additionally include a step 304 where a contact (e.g. the source contact 106 and/or the drain contact 108) is formed over the first conductive layer 104.

Figure 3B:
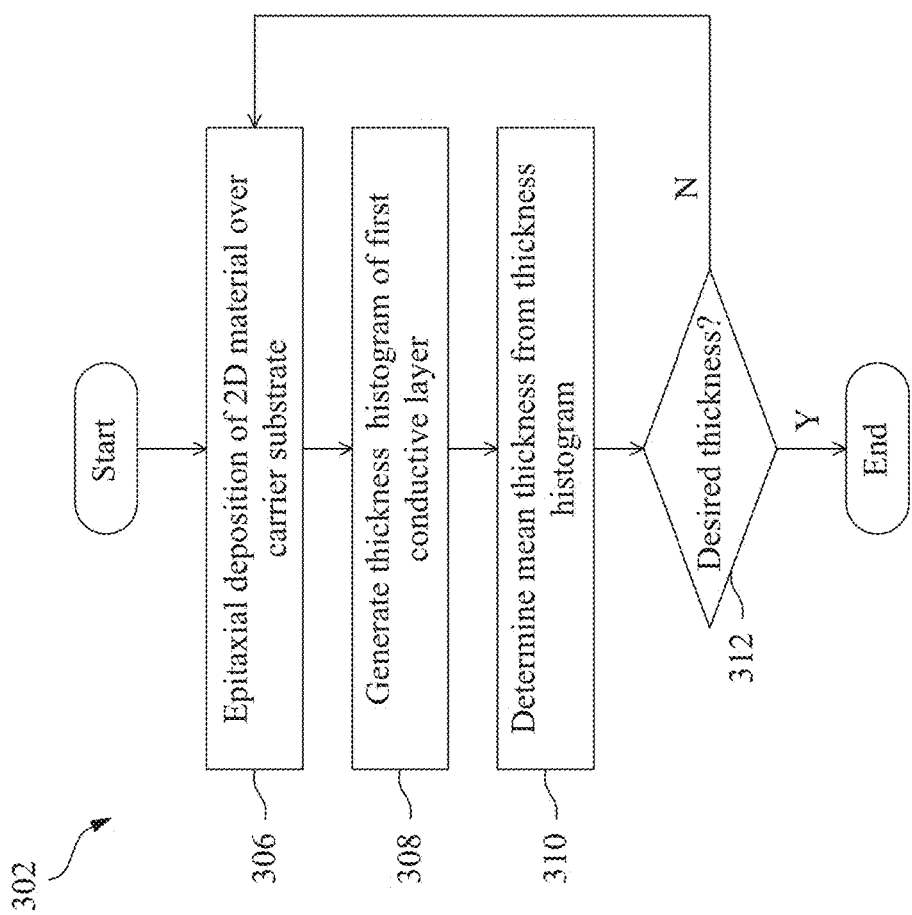
FIG. 3B shows some of the steps of a method of manufacturing a first conductive layer comprising a multi-layer two dimensional material, in accordance with some embodiments.

FIG. 3B shows in greater detail the step 302 shown in FIG. 3A, where the first conductive layer 104 is formed over the carrier substrate 102, in accordance with one or more embodiments. As shown in FIG. 3B, a first iteration of the step 302 comprises epitaxially depositing a 2D material over the carrier substrate 102 (e.g. in step 306 shown in FIG. 3B). In an embodiment, the epitaxial deposition process may form a one-molecule thick or a two-molecule thick 2D material layer over the carrier substrate 102, depending on the process parameters of the epitaxial deposition process. The epitaxial deposition process used to form the 2D material over the carrier substrate 102 is described in greater detail below in respect of FIG. 4A.

Following the epitaxial deposition of the 2D material over the carrier substrate 102, a thickness histogram of the first conductive layer 104 may be generated (e.g. in step 308 shown in FIG. 3B). The thickness histogram that is generated may be used to determine or calculate a parameter (e.g. the mean thickness TA of the first conductive layer 104), e.g. in step 310 shown in FIG. 3B. As shown in FIG. 3B, the step 302 of forming the first conductive layer 104 may continue with a comparison of the determined or calculated parameter (e.g. mean thickness TA of the first conductive layer 104) with a reference parameter (e.g. desired thickness), e.g. in step 312 shown in FIG. 3B. The desired thickness of the first conductive layer 104 may, as an example, be a predetermined desired thickness of the first conductive layer 104 based on the application of the semiconductor device 100. If the desired thickness is not achieved, the epitaxial deposition process may be repeated (e.g. by repeating step 306) in an effort to form another one-molecule thick or two-molecule thick 2D material layer over the previously deposited 2D material layer. Consequently, the number of sub-layers and the mean thickness TA of the first conductive layer 104 may be increased by a second iteration of the epitaxial deposition process shown in step 306.

Following the second iteration of the epitaxial deposition process, the thickness histogram of the first conductive layer 104 may be regenerated (e.g. by repeating step 308), and the mean thickness TA of the first conductive layer 104 may be re-determined or recalculated from the regenerated thickness histogram of the first conductive layer 104 (e.g. by repeating step 310). As such, the mean thickness TA of the first conductive layer 104 may be tracked with each iteration of the epitaxial deposition process in an effort to control the mobility of carriers in the first conductive layer 104. In the event that the mean thickness TA determined or calculated from the regenerated thickness histogram of the first conductive layer 104 is not substantially equal to the desired thickness, a third iteration of the epitaxial deposition process may be performed (e.g. by repeating step 306) in an effort to form another one-molecule thick or two-molecule thick 2D material layer over the previously deposited 2D material layer. This is followed by a regeneration of the thickness histogram of the first conductive layer 104 and a redetermination or recalculation of the mean thickness from the regenerated thickness histogram. This process of iteratively performing the epitaxial deposition process, generating the thickness histogram of the first conductive layer 104, and determining or calculating the mean thickness TA of the first conductive layer may be continued until the desired thickness is achieved. When the desired thickness is achieved, the step 302 of forming the first conductive layer 104 may be terminated, and the method 300 of manufacturing the semiconductor device 100 may continue with the step 304 where the contact is formed over the first conductive layer 104.

Figure 4A:
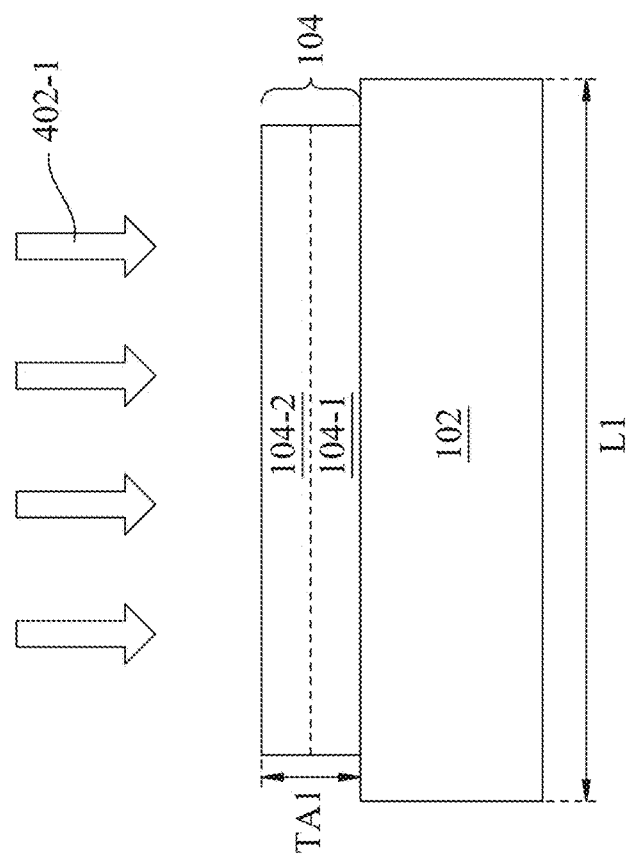

FIGS. 4A to 4L show a process flow illustrating some of the steps of the method 300 of manufacturing the semiconductor device 100, in accordance with one or more embodiments. Referring to FIG. 4A, the method 300 of manufacturing the semiconductor device 100 may include forming the first conductive layer 104 over the carrier substrate 102, e.g. using a first iteration 402-1 of a first deposition process 402. In the example of FIG. 4A, the first conductive layer 104 is formed over the carrier substrate 102 such that a portion (e.g. a peripheral portion) of the carrier substrate 102 is free from the first conductive layer 104. However, in other embodiments, the first conductive layer 104 may be formed over an entire extent of the carrier substrate 102. The first iteration 402-1 of the first deposition process 402 may be carried out while the carrier substrate 102 is disposed in a reaction chamber (not shown in FIG. 4A).

In the example shown in FIG. 4A, the first iteration 402-1 of the first deposition process 402 forms a two-molecule thick 2D material layer (e.g. a two-molecule thick TMD material layer comprising the first sub-layer 104-1 and the second sub-layer 104-2) over the carrier substrate 102. However, in another embodiment, the first iteration 402-1 of the first deposition process 402 may form a one-molecule thick 2D material layer over the carrier substrate 102. The number of sub-layers formed by the first iteration 402-1 of the first deposition process 402 may be controlled by varying the amount of precursors introduced into the reaction chamber as well as the pressure and/or temperature under which the first iteration 402-1 of the first deposition process 402 is performed. As an example, the first iteration 402-1 of the first deposition process 402 may form a two-molecule thick 2D material layer over the carrier substrate 102 by having a first amount of a transition metal-containing compound in the process gas, and having a second amount of a group IVA-containing compound in the process gas. In comparison, the first iteration 402-1 of the first deposition process 402 may form a one-molecule thick 2D material layer over the carrier substrate 102 by decreasing the first amount of the transition metal-containing compound in the process gas, while maintaining the second amount of the group IVA-containing compound in the process gas. While the number of sub-layers formed by the first iteration 402-1 of the first deposition process 402 may be controlled, it is noted that it may be desirable that no more than two sub-layers are formed by the first iteration 402-1 of the first deposition process 402 (or by any iteration 402-x of the first deposition process 402).

The first deposition process 402 may be an epitaxial chemical vapor deposition (CVD) process. Consequently, the first iteration 402-1 of the first deposition process 402 may be an epitaxial CVD process that grows (e.g. epitaxially) the first sub-layer 104-1 directly on the carrier substrate 102, and the second sub-layer 104-2 directly on the first sub-layer 104-1.

In a typical CVD process, a metal substrate (such as Cu or Ni) may be used as a catalyst (e.g. for methane ($CH_4$) decomposition) and the first conductive layer 104 may be initially formed on the metal substrate by the typical CVD process. Thereafter, the first conductive layer 104 may be removed from the metal substrate and transferred and subsequently reattached to an electronic device-compatible substrate (e.g. the carrier substrate 102). The first deposition process 402 differs from the above-described typical CVD process in that the first deposition process 402 is a metal catalyst-free CVD process that directly grows (e.g. epitaxially) the first conductive layer 104 on an electronic device-compatible substrate (e.g. the carrier substrate 102).

In an embodiment, the first deposition process 402 may be conducted at a temperature less than or equal to about 1000 degrees Celsius, e.g. in a range from about 700 degrees Celsius to about 1000 degrees Celsius or in a range from about 600 degrees Celsius to about 700 degrees Celsius. These ranges of temperatures may, as an example, be in a range of temperatures typically used in semiconductor processing. Consequently, the first deposition process 402 may be easily integrated with existing semiconductor processing steps and easily implemented with existing semiconductor processing equipment.

The first deposition process 402 may include flowing a carrier gas (such as $N_2$ gas, Ar gas, or an inert gas) and one or more process gases into the reaction chamber. As a first example, in an embodiment where the first conductive layer 104 comprises $MoS_2$, the process gas may comprise precursor materials such as sulfur and $MoCl_2$ or $MoCl_5$. This process gas is introduced into the reaction chamber together with the carrier gas (e.g. $N_2$ carrier gas or Ar carrier gas). The precursor materials of the process gas may then react at an elevated temperature (e.g. in a range from about 800 degrees Celsius to about 900 degrees Celsius) to produce an $MoS_2$ species that may subsequently precipitate onto the carrier substrate 102 to yield the first conductive layer 104 comprising $MoS_2$. In an embodiment where the first iteration 402-1 of the first deposition process 402 forms a two-molecule thick $MoS_2$ layer over the carrier substrate 102, approximately 1 gram of sulfur and approximately 4 milligrams of $MoCl_2$ or $MoCl_5$ may be present in the process gas.

As a second example, in an embodiment where the first conductive layer 104 comprises $MoS_2$, the process gas may comprise precursor materials such as $MoO_3$ and sulfur. This process gas is introduced into the reaction chamber together with the carrier gas (e.g. $N_2$ carrier gas or Ar carrier gas). The precursor materials of the process gas may then react at an elevated temperature (e.g. in a range from about 600 degrees Celsius to about 700 degrees Celsius) to produce an $MoS_2$ species that may subsequently precipitate onto the first conductive layer 104 to yield the first conductive layer 104 comprising $MoS_2$. In an embodiment where the first iteration 402-1 of the first deposition process 402 forms a two-molecule thick $MoS_2$ layer over the carrier substrate 102, approximately 1 gram of sulfur and approximately 4 milligrams of $MoO_3$ may be present in the process gas.

Figure 4B:
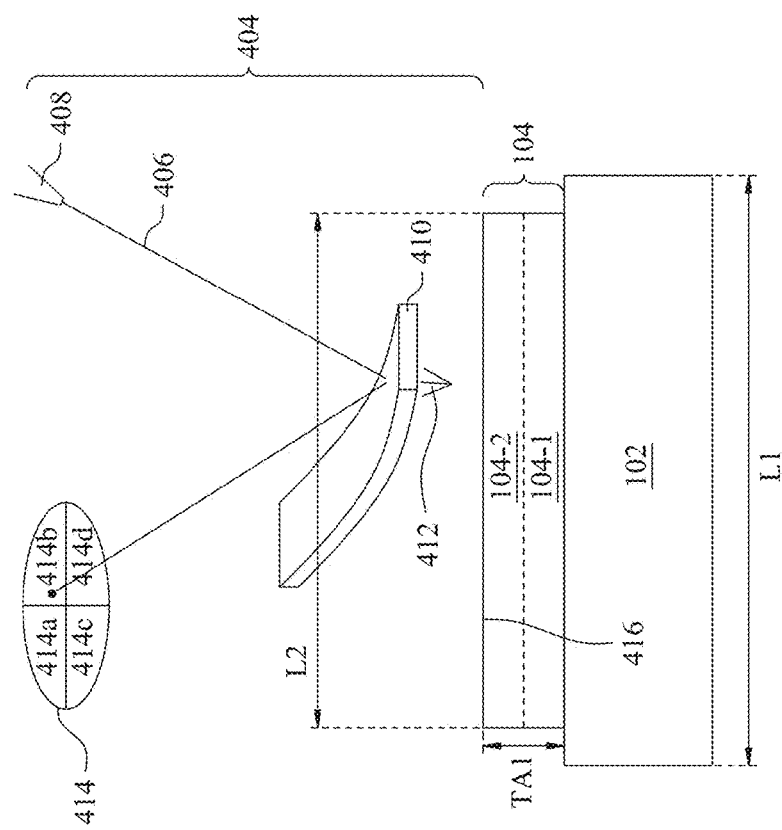

Referring to FIG. 4B, the process flow continues with the generation of a first thickness histogram of the first conductive layer 104. The first thickness histogram may be a distribution of local thicknesses of the first conductive layer 104 taken along the second lateral dimension L2 (such as the local thicknesses T1, T2, T3 described above in relation to FIG. 1). The first thickness histogram may be generated using, as an example, a scanning probe microscope (SPM) 404. To illustrate this step in greater detail, the first conductive layer 104 comprising two $MoS_2$ sub-layers was formed over the carrier substrate 102 in an experiment using the first iteration 402-1 of the first deposition process 402 described above in respect of FIG. 4A. A first thickness histogram 502, shown in FIG. 5, was generated from the first conductive layer 104 comprising the two $MoS_2$ sub-layers using the SPM 404. An atomic force microscope (AFM) is an example of the SPM 404, and the first thickness histogram 502 shown in FIG. 5 was generated using the AFM.

In an embodiment, the SPM 404 may be designed to measure local properties of the first conductive layer 104, such as height, friction, magnetism, with a probe comprising a cantilever 410 and a probe tip 412 (e.g. comprising a piezo-ceramic material). The first thickness histogram 502 can be generated by scanning (e.g. raster-scanning) or dragging the probe tip 412 over a major surface 416 of the first conductive layer 104, while simultaneously measuring the local property (e.g. height, friction, magnetism). As an example, the SPM 404 may measure deflections (e.g. vertical and/or lateral deflections) of the cantilever 410 as the SPM 404 scans or drags the probe tip 412 over the major surface 416 of the first conductive layer 104, thereby generating a plurality of local thicknesses of the first conductive layer 104. The plurality of local thicknesses of the first conductive layer 104 may subsequently be used to generate the first thickness histogram 502 of the first conductive layer 104, from which a parameter may be determined or calculated. For example, the parameter may be a first mean thickness TA1 of the first conductive layer 104.

As an example, the SPM 404 can measure the deflection of the cantilever 410 by using an optical system comprising a position-sensitive photo-detector 414 and a laser source 408 configured to emit a laser beam 406. The optical system operates by reflecting the laser beam 406 off the cantilever 410, as shown in FIG. 4B. The reflected laser beam strikes the position-sensitive photo-detector 414 that may comprise four segments 414a, 414b, 414c, 414d. The differences in photo-intensity among the four segments 414a, 414b, 414c, 414d of the photo-detector 414 may be used to determine (e.g. calculate) the position of the laser spot on the photo-detector 414. The position of the laser spot on the photo-detector 414 may be correlated to the deflection of the cantilever 410, which may, in turn, be correlated to a local thickness of the first conductive layer 104. Consequently, the deflections of the cantilever 410 as the SPM 404 scans or drags the probe tip 412 over the major surface 416 may be used to determine (e.g. calculate) a plurality of the local thicknesses of the first conductive layer 104, which may, in turn, be used to generate the first thickness histogram 502 of the first conductive layer 104. This process of generating the first thickness histogram 502 (and subsequent thickness histograms) may be referred to as film depth profiling.

Figure 5:
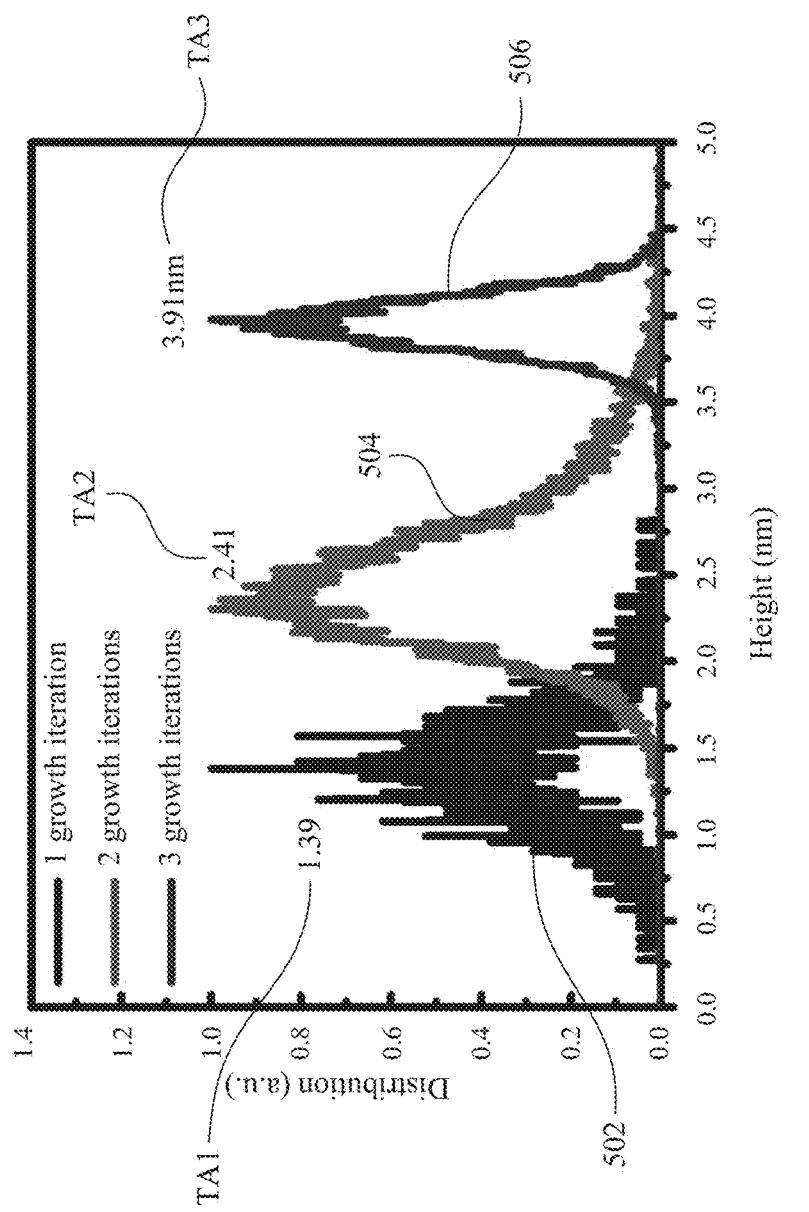
FIG. 5 shows various thickness histograms, in accordance with some embodiments.

Referring to FIG. 5, as shown in the first thickness histogram 502, the local thicknesses of the first conductive layer 104 shown in FIG. 4B may be in a range from about 0.25 nm to about 2.7 nm. The first mean thickness TA1 of the first conductive layer 104 may be determined or calculated from the first thickness histogram 502. For example, the first mean thickness TA1 of the first conductive layer 104 shown in FIG. 4B may be in a range from about 1 nm to about 1.6 nm (e.g. about 1.39 nm) and may, as an example, occur at a peak of the first thickness histogram 502. The first mean thickness TA1 may be correlated to the number of sub-layers in the first conductive layer 104 following the first iteration 402-1 of the first deposition process 402. For example, if the first mean thickness TA1 is in a range from about 1 nm to about 1.6 nm, this may indicate that the first conductive layer 104 comprises two 2D material sub-layers, as in the example of FIG. 5 where the first thickness histogram 502 is a distribution of local thicknesses of the first conductive layer 104 comprising the two $MoS_2$ sub-layers. By way of another example, if the first mean thickness TA1 is in a range from about 0.5 nm to about 0.75 nm, this may indicate that the first conductive layer 104 comprises one 2D material sub-layer.

Figure 6:
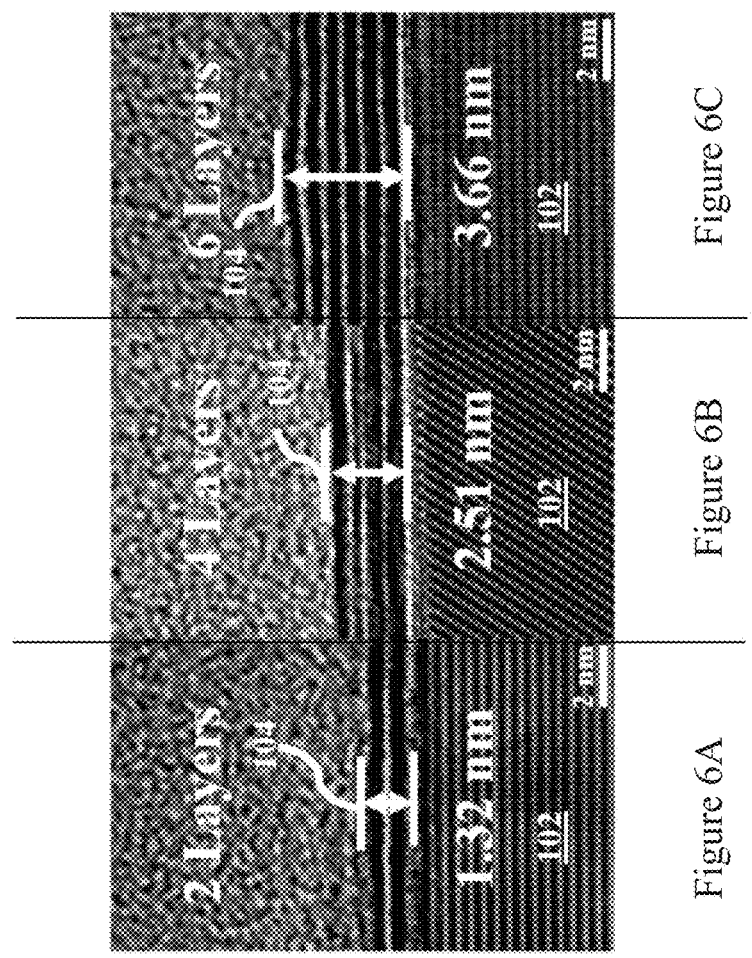
FIGS. 6A to 6C show various cross-sectional images of a carrier substrate and a first conductive layer, in accordance with some embodiments.

To demonstrate the accuracy of using the SPM 404 in determining or calculating the first mean thickness TA1 and in estimating the number of sub-layers in the first conductive layer 104 from the first mean thickness TA1, a high-resolution transmission electron microscopy (HRTEM) image of the carrier substrate 102 and the first conductive layer 104 comprising the two $MoS_2$ sub-layers was generated. FIG. 6A shows an HRTEM image of a cross-section of a portion of the carrier substrate 102 and the first conductive layer 104 comprising the two $MoS_2$ sub-layers. As shown in FIG. 6A, two $MoS_2$ sub-layers are indeed formed over the carrier substrate 102 using the first iteration 402-1 of the first deposition process 402, and the measured thickness of the first conductive layer 104 comprising the two $MoS_2$ sub-layers is about 1.32 nm. The measured thickness is within 0.07 nm of the first mean thickness TA1 (e.g. about 1.39 nm) determined or calculated from the first thickness histogram 502 shown in FIG. 5. These observations from the HRTEM image in FIG. 6A indicate that the first mean thickness TA1 determined or calculated from the first thickness histogram 502 is an accurate parameter that may be used to estimate the actual thickness of the first conductive layer 104 as well as the number of 2D material sub-layers in the first conductive layer 104 following the first iteration 402-1 of the first deposition process 402.

While there may be other approaches (e.g. Raman spectroscopy and/or transmission electron microscopy) for determining or calculating the first mean thickness TA1 of the first conductive layer 104, such alternative approaches may have drawbacks compared to the use of the SPM 404. For example, Raman spectroscopy may be used; however, Raman measurements may give inaccurate data on the number of 2D material sub-layers in the first conductive layer 104. As another example, an HRTEM image such as the one shown in FIG. 6A may be used; however, the generation of HRTEM images is time-consuming and expensive. In comparison, the first thickness histogram 502 generated using the SPM 404 may be done automatically, quickly, and, as demonstrated in FIGS. 5 and 6A, the first mean thickness TA1 provides a substantially accurate estimate of the actual thickness of the first conductive layer 104 and the number of 2D material sub-layers in the first conductive layer 104 following the first iteration 402-1 of the first deposition process 402. Consequently, the first thickness histogram 502 can be a useful tool for in-process monitoring for the thickness of the first conductive layer 104 and the number of 2D material sub-layers in the first conductive layer 104 following the first iteration 402-1 of the first deposition process 402.

Supposing a desired thickness for the first conductive layer 104 is about 4 nm, comparing the first mean thickness TA1 of about 1.39 with the desired thickness of about 4 nm would indicate that a second iteration of the first deposition process 402 may be necessary to form one or more additional 2D material sub-layers over the second 2D material sub-layer 104-2. Referring to FIG. 4C, the second iteration 402-2 of the first deposition process 402 may be carried out while the carrier substrate 102 is disposed in the reaction chamber (not shown in FIG. 4C). The process parameters of the second iteration 402-2 of the first deposition process 402 may be substantially the same as the process parameters of the first iteration 402-1 of the first deposition process 402. In the example shown in FIG. 4C, the second iteration 402-2 of the first deposition process 402 forms two additional 2D material sub-layers (e.g. a third 2D material sub-layer 104-3 and a fourth 2D material sub-layer 104-4) over the second sub-layer 104-2. However, in another embodiment, the second iteration 402-2 of the first deposition process 402 may form one additional 2D material sub-layer over the second sub-layer 104-2. The third 2D material sub-layer 104-3 and the fourth 2D material sub-layer 104-4 may comprise $MoS_2$, $MoSe_2$, $WS_2$, $WSe_2$, combinations thereof, or the like. As described above in relation to FIG. 4A, the number of sub-layers formed by each iteration 402-x of the first deposition process 402 may be controlled by varying the amount of precursors introduced into the reaction chamber as well as the pressure and/or temperature under which the iteration 402-x of the first deposition process 402 is performed. While the number of sub-layers formed may be controlled, it is noted that it may be desirable that no more than two sub-layers are formed by any iteration 402-x of the first deposition process 402.

Figure 4D:
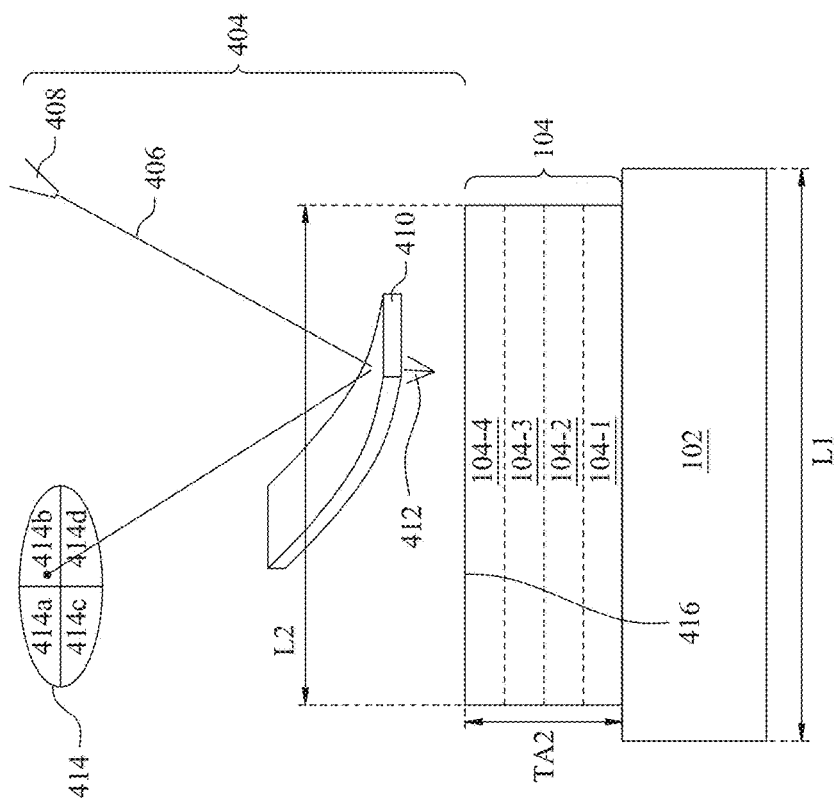

Referring to FIG. 4D, the process flow continues with the generation of a second thickness histogram of the first conductive layer 104. The second thickness histogram may be a distribution of local thicknesses of the first conductive layer 104 (comprising the four 2D material sub-layers 104-1 to 104-4) taken along the second lateral dimension L2. The second thickness histogram may be generated using, as an example, the SPM 404 using the process described above in respect of FIG. 4B. To illustrate this step in greater detail, the first conductive layer 104 comprising four $MoS_2$ sub-layers was formed over the carrier substrate 102 in an experiment using the process flow described above in relation to FIGS. 4A to 4C. A second thickness histogram 504, shown in FIG.

5, was generated from the first conductive layer 104 comprising the four MoS$_2$ sub-layers using the SPM 404 (e.g. AFM).

Referring to FIG. 5, as shown in the second thickness histogram 504, the local thicknesses of the first conductive layer 104 shown in FIG. 4D may be in a range from about 1.3 nm to about 4.5 nm. A second mean thickness TA2 of the first conductive layer 104 may be determined or calculated from the second thickness histogram 504. For example, the second mean thickness TA2 of the first conductive layer 104 shown in FIG. 4C may be in a range from about 2 nm to about 3 nm (e.g. about 2.41 nm) and may, as an example, occur at a peak of the second thickness histogram 504. The second mean thickness TA2 may be correlated to the number of sub-layers in the first conductive layer 104 following the second iteration 402-2 of the first deposition process 402. For example, if the second mean thickness TA2 is in a range from about 2 nm to about 3 nm, this may indicate that the first conductive layer 104 comprises four 2D material sub-layers, as in the example of FIG. 5 where the second thickness histogram 504 is a distribution of local thicknesses of the first conductive layer 104 comprising the four MoS$_2$ sub-layers.

As shown in FIG. 5, the peak of the second thickness histogram 504 is more defined compared to the first thickness histogram 502. It may also be observed that the standard deviation of local thicknesses of the second thickness histogram 504 about the second mean thickness TA2 is smaller than the standard deviation of local thicknesses of the first thickness histogram 502 about the first mean thickness TA1. This suggests that the second iteration 402-2 of the first deposition process 402 improves the uniformity of local thickness of the first conductive layer 104 along the second lateral dimension L2.

To demonstrate the accuracy of using the SPM 404 in determining or calculating the second mean thickness TA2 and in estimating the number of sub-layers in the first conductive layer 104 from the second mean thickness TA2, an HRTEM image of the carrier substrate 102 and the first conductive layer 104 comprising the four MoS$_2$ sub-layers was generated. FIG. 6B shows an HRTEM image of a cross-section of a portion of the carrier substrate 102 and the first conductive layer 104 comprising the four MoS$_2$ sub-layers. As shown in FIG. 6B, four MoS$_2$ sub-layers are indeed formed over the carrier substrate 102 using the first iteration 402-1 and the second iteration 402-2 of the first deposition process 402, and the measured thickness of the first conductive layer 104 comprising the two MoS$_2$ sub-layers is about 2.51 nm. The measured thickness is within 0.1 nm of the second mean thickness TA2 (e.g. about 2.41 nm) determined or calculated from the second thickness histogram 504 shown in FIG. 5. These observations from the HRTEM image in FIG. 6B indicate that the second mean thickness TA2 determined or calculated from the second thickness histogram 504 is an accurate parameter that may be used to estimate the actual thickness of the first conductive layer 104 as well as the number of 2D material sub-layers in the first conductive layer 104 following the second iteration 402-2 of the first deposition process 402.

While there may be other approaches (e.g. Raman spectroscopy and/or transmission electron microscopy) for determining or calculating the second mean thickness TA2 of the first conductive layer 104, such alternative approaches may have drawbacks compared to the use of the SPM 404, as described above in relation to FIG. 4B. Consequently, the second thickness histogram 504 generated using the SPM 404 may be done automatically, quickly, and, as demonstrated in FIGS. 5 and 6B, the second mean thickness TA2 provides a substantially accurate estimate of the actual thickness of the first conductive layer 104 and the number of 2D material sub-layers in the first conductive layer 104 following the second iteration 402-2 of the first deposition process 402. Consequently, the second thickness histogram 504 can be a useful tool for in-process monitoring for the mean thickness of the first conductive layer 104 and the number of 2D material sub-layers in the first conductive layer 104 following the second iteration 402-2 of the first deposition process 402.

Figure 4E:
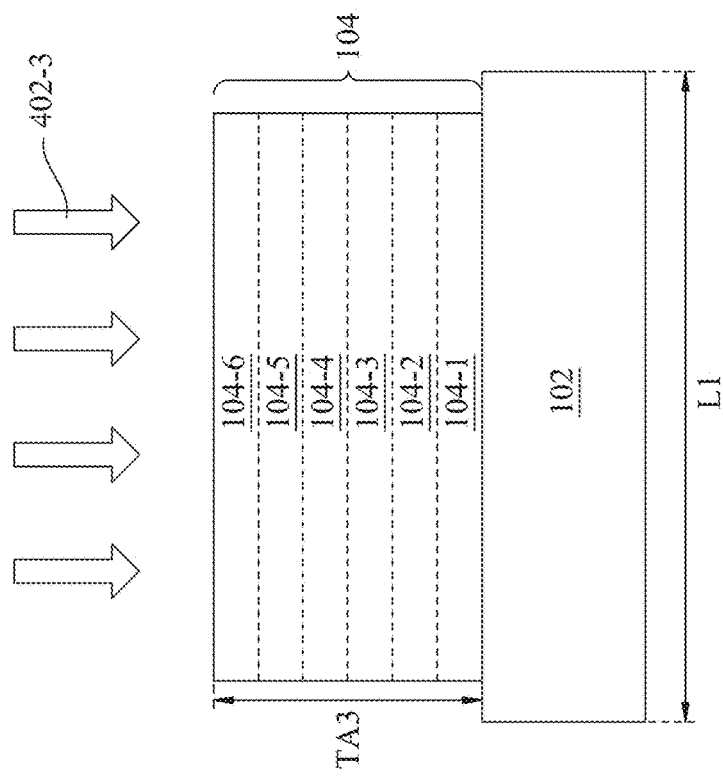

Supposing the desired thickness for the first conductive layer 104 is about 4 nm, comparing the second mean thickness TA2 of about 2.41 with the desired thickness of about 4 nm would indicate that a third iteration of the first deposition process 402 may be necessary to form one or more additional 2D material layers over the second 2D material sub-layer 104-2. Referring to FIG. 4E, the third iteration 402-3 of the first deposition process 402 may be carried out while the carrier substrate 102 is disposed in the reaction chamber (not shown in FIG. 4E). The process parameters of the third iteration 402-3 of the first deposition process 402 may be substantially the same as the process parameters of the first iteration 402-1 of the first deposition process 402. In the example shown in FIG. 4E, the third iteration 402-3 of the first deposition process 402 forms two additional 2D material sub-layers (e.g. a fifth 2D material sub-layer 104-5 and a sixth 2D material sub-layer 104-6) over the fourth sub-layer 104-4. However, in another embodiment, the third iteration 402-3 of the first deposition process 402 may form one additional 2D material sub-layer over the second sub-layer 104-2. The fifth 2D material sub-layer 104-5 and the sixth 2D material sub-layer 104-6 may comprise MoS$_2$, MoSe$_2$, WS$_2$, WSe$_2$, combinations thereof, or the like. As described above in relation to FIG. 4A, the number of sub-layers formed by the each iteration 402-x of the first deposition process 402 may be controlled by varying the amount of precursors introduced into the reaction chamber as well as the pressure and/or temperature under which the iteration 402-x of the first deposition process 402 is performed. While the number of sub-layers formed may be controlled, it is noted that it may be desirable that no more than two sub-layers are formed by any iteration 402-x of the first deposition process 402.

Figure 4F:
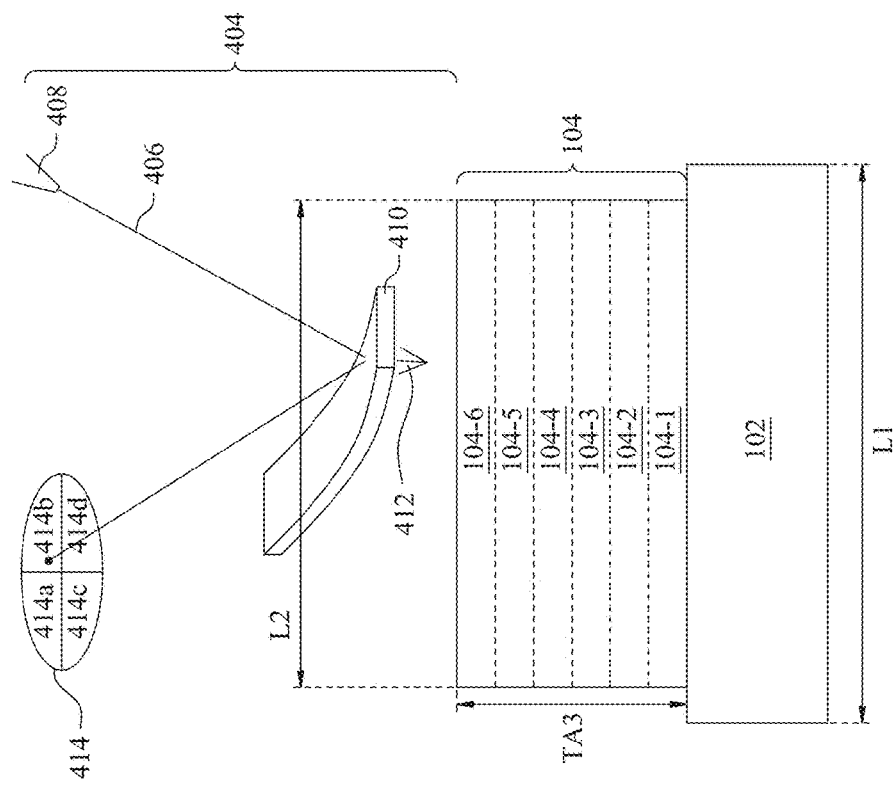

Referring to FIG. 4F, the process flow continues with the generation of a third thickness histogram of the first conductive layer 104. The third thickness histogram may be a distribution of local thicknesses of the first conductive layer 104, comprising the six sub-layers 104-1 to 104-6, taken along the second lateral dimension L2. The third thickness histogram may be generated using, as an example, the SPM 404 using the process described above in respect of FIG. 4B. To illustrate this step in greater detail, the first conductive layer 104 comprising six MoS$_2$ sub-layers was formed in an experiment over the carrier substrate 102 using the process flow described above in relation to FIGS. 4A to 4E. The third thickness histogram 506, shown in FIG. 5, was generated from the first conductive layer 104 comprising the six MoS$_2$ sub-layers using the SPM 404 (e.g. AFM).

Referring to FIG. 5, as shown in the third thickness histogram 506, the local thicknesses of the first conductive layer 104 shown in FIG. 4E may be in a range from about 3.5 nm to about 4.5 nm. A third mean thickness TA3 of the first conductive layer 104 may be determined or calculated from the third thickness histogram 506. For example, the third mean thickness TA3 of the first conductive layer 104 shown in FIG. 4E may be in a range from about 3.75 nm to about 4.25 nm (e.g. about 3.91 nm) and may, as an example, occur at a peak of the third thickness histogram 506. The third mean thickness TA3 may be correlated to the number of sub-layers in the first conductive layer 104 following the third iteration 402-3 of the first deposition process 402. For example, if the third mean thickness TA3 is in a range from about 3.75 nm to about 4.25 nm, this may indicate that the first conductive layer 104 comprises six 2D material sub-layers, as in the example of FIG. 5 where the third thickness histogram 506 is a distribution of local thicknesses of the first conductive layer 104 comprising the six MoS$_2$ sub-layers.

As shown in FIG. 5, the peak of the third thickness histogram 506 is more defined compared to the second thickness histogram 504 and the first thickness histogram 501. It may also be observed that the standard deviation of local thicknesses of the third thickness histogram 506 about the third mean thickness TA3 is smaller than the standard deviation of local thicknesses of the second thickness histogram 504 about the second mean thickness TA2. This suggests that the third iteration 402-3 of the first deposition process 402 improves the uniformity of local thickness of the first conductive layer 104 along the second lateral dimension L2.

To demonstrate the accuracy of using the SPM 404 in determining or calculating the third mean thickness TA3 and in estimating the number of sub-layers in the first conductive layer 104 from the third mean thickness TA3, an HRTEM image of the carrier substrate 102 and the first conductive layer 104 comprising six MoS$_2$ sub-layers was generated. FIG. 6C shows an HRTEM image of a cross-section of a portion of the carrier substrate 102 and the first conductive layer 104 comprising the six MoS$_2$ sub-layers. As shown in FIG. 6C, six MoS$_2$ sub-layers are indeed formed over the carrier substrate 102 using the first iteration 402-1, the second iteration 402-2, and the third iteration 402-3 of the first deposition process 402, and the measured thickness of the first conductive layer 104 comprising the two MoS$_2$ sub-layers is about 3.66 nm. The measured thickness is within 0.25 nm of the third mean thickness TA3 (e.g. about 3.91 nm) determined or calculated from the third thickness histogram 506 shown in FIG. 5. These observations from the HRTEM image in FIG. 6C indicate that the third mean thickness TA3 determined or calculated from the third thickness histogram 506 is an accurate parameter that may be used to estimate the actual thickness of the first conductive layer 104 as well as the number of 2D material sub-layers in the first conductive layer 104 following the third iteration 402-3 of the first deposition process 402.

While there may be other approaches (e.g. Raman spectroscopy and/or transmission electron microscopy) for determining or calculating the third mean thickness TA3 of the first conductive layer 104, such alternative approaches may have drawbacks compared to the use of the SPM 404, as described above in relation to FIG. 4B. Consequently, the third thickness histogram 506 generated using the SPM 404 may be done automatically, quickly, and, as demonstrated in FIGS. 5 and 6C, the third mean thickness TA3 provides a substantially accurate estimate of the actual thickness of the first conductive layer 104 and the number of 2D material sub-layers in the first conductive layer 104 following the third iteration 402-3 of the first deposition process 402. Consequently, the third thickness histogram 506 can be a useful tool for in-process monitoring for the mean thickness of the first conductive layer 104 and the number of 2D material sub-layers in the first conductive layer 104 following the third iteration 402-3 of the first deposition process 402.

Supposing the desired thickness for the first conductive layer 104 is about 4 nm, comparing the third mean thickness TA3 of about 3.91 with the desired thickness of about 4 nm would indicate that the third mean thickness TA3 is substantially equal to the desired thickness. In an embodiment, if a mean thickness determined or calculated from a thickness histogram is within about 0.5 nm of the desired thickness, the mean thickness may be considered as being substantially equal to the desired thickness. As indicated in FIG. 3B, this may indicate that another iteration of the first deposition process 402 may not be necessary, and thus, the process flow can continue with the formation of the contact (e.g. the source contact 106 and/or the drain contact 108) over the first conductive layer 104.

Figure 4G:
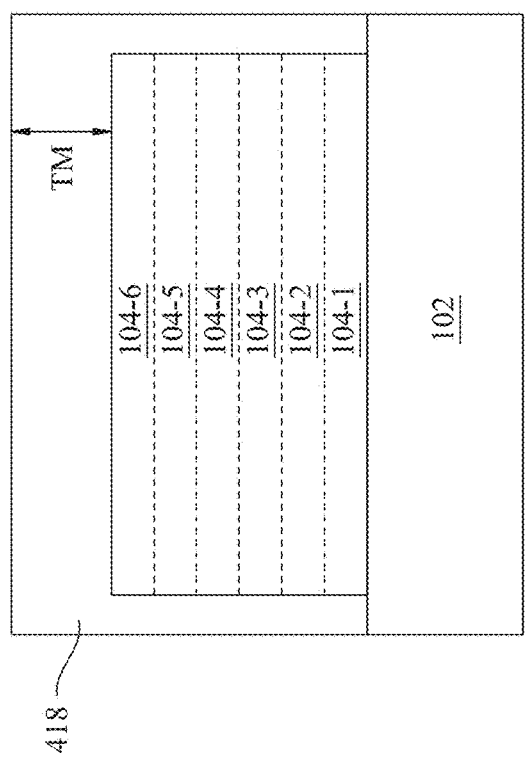

Referring to FIG. 4G, a mask 418 may initially be formed over the first conductive layer 104. The mask 418 may completely cover sidewalls and a top surface the first conductive layer 104, as shown in FIG. 4G. The mask 418 may also cover exposed surfaces of the carrier substrate 102. The mask 418 may be formed using a suitable process such as chemical vapor deposition, plasma enhanced chemical vapor deposition, atomic layer deposition, or the like. However, other suitable methods of forming the mask 418 may be utilized. In an embodiment, the mask 418 comprises a dielectric material such as silicon nitride, titanium nitride, silicon oxynitride, combinations thereof, or the like. However, it should be understood that the mask 418 may comprise other suitable materials. The mask 418 may be formed such that the portion of the mask 418 disposed over the top surface of the first conductive layer 104 has a thickness TM between about 200 nm and about 300 nm, such as about 100 nm.

Figure 4H:
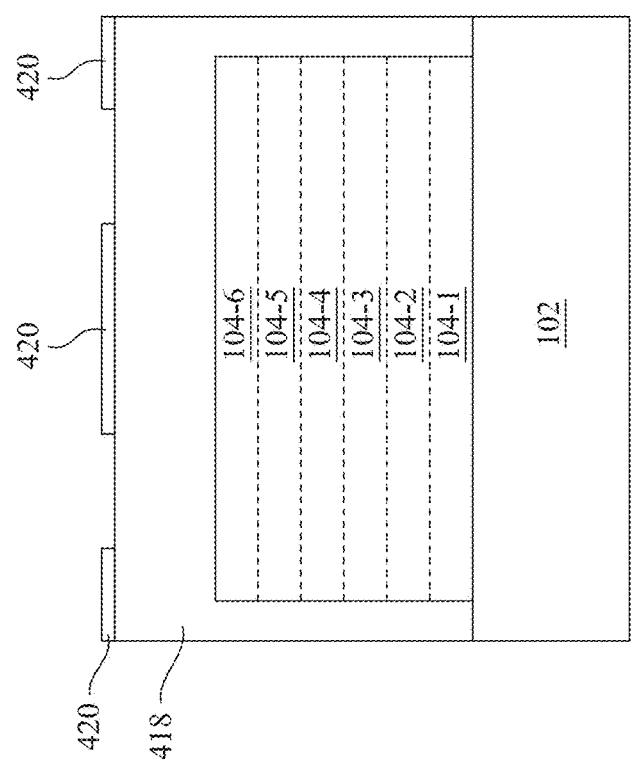
Figure 4I:
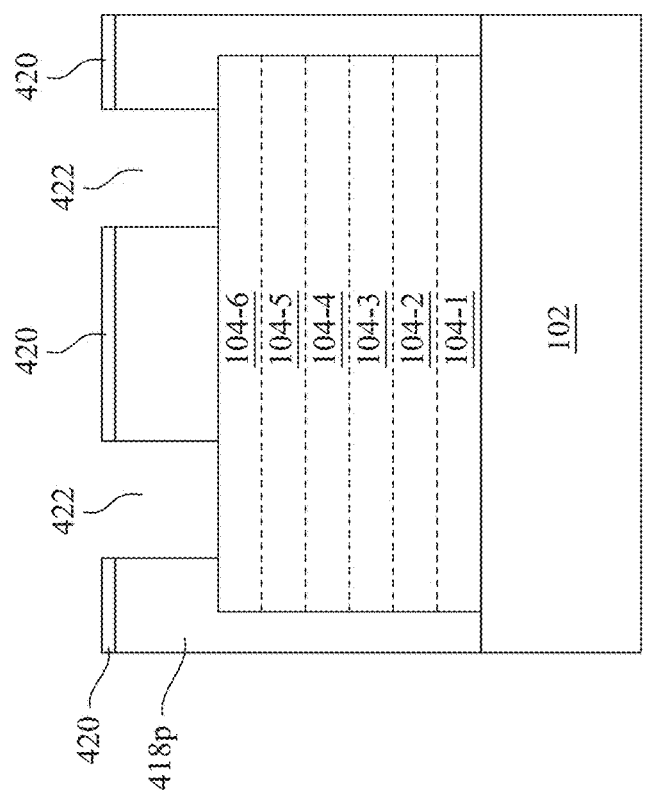

Once the mask 418 has been formed, portions of the mask 418 may be removed in order to expose regions of the first conductive layer 104 over which the source contact 106 and the drain contact 108 are to be formed. In other words, the mask 418 may be patterned to expose regions of the first conductive layer 104. As shown in the example of FIG. 4H, the mask 418 may be patterned by initially forming a patterned photoresist 420 over the mask 418. The patterned photoresist 420 may be formed by depositing a photosensitive material over the mask 418 and subsequently patterning the photosensitive material to yield the patterned photoresist 420. The photosensitive material may be deposited over the mask 418 using spin-on coating, chemical vapor deposition, plasma enhanced chemical vapor deposition, atomic layer deposition, or the like. The photosensitive material may be patterned using, for example, a lithographic process (e.g. a photo-lithographic process).

Following the formation of the patterned photoresist 420, the mask 418 may be patterned using the patterned photoresist 420 as a mask. The result of this processing step is a patterned mask 418p, shown in FIG. 4I, having openings 422 therein. The openings 422 may define the boundaries (e.g. the sidewalls) of the source contact 106 and the drain contact 108 that are subsequently formed. In an embodiment, an etching process (e.g. a reactive ion etching process) may be used to pattern the mask 418. However, other suitable processes for patterning the mask 418 may also be used. The patterning of the mask 418 may continue until portions of the first conductive layer 104 are exposed.

Figure 4J:
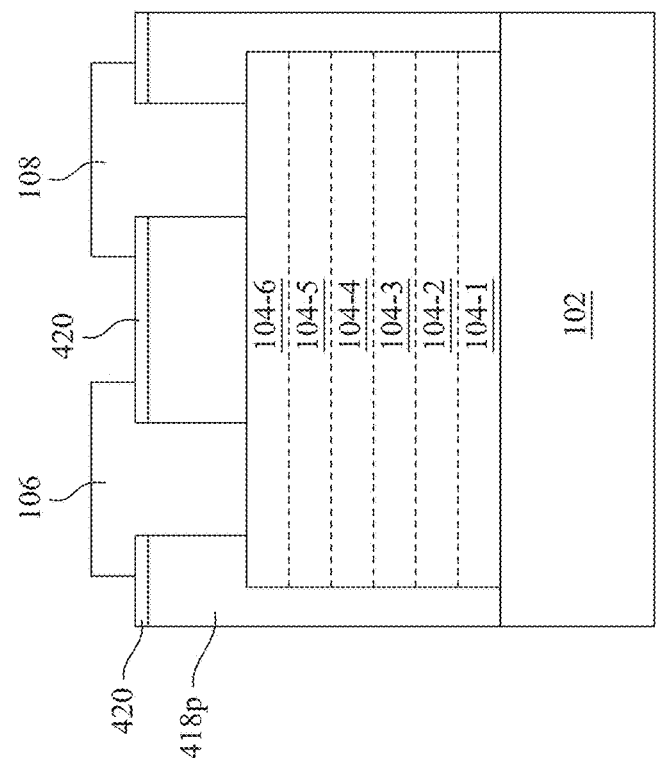

Referring to FIG. 4J, the openings 422 may be filled with a conductive material to form the source contact 106 and the drain contact 108. The conductive material of the source contact 106 and the drain contact 108 may comprise copper, aluminum, palladium, silver, nickel, gold, titanium, gadolinium, alloys thereof, or the like, and may be formed by a deposition process. The deposition process may be continued at least until the openings 422 have been filled with the conductive material of the source contact 106 and the drain contact 108. Additionally, to ensure a complete filling of the openings 422, the deposition process may be continued to overfill the openings 422, as shown in the example of FIG. 4J. Such an overfilling can result in portions of the source contact 106 and the drain contact 108 extending laterally such that an extension of the source contact 106 and the drain contact 108 partially extends over a portion of the patterned photoresist 420.

Figure 4K:
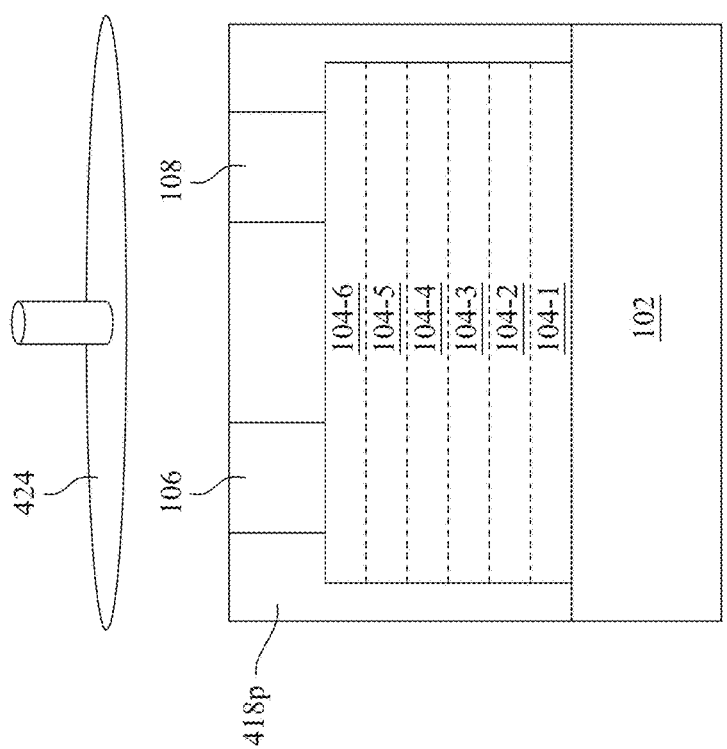

FIG. 4K illustrates a planarization process 424, which may be utilized to planarize the source contact 106 and the drain contact 108 and to expose the surface of the patterned mask 418p. In so doing, top surfaces of the source contact 106 and the drain contact 108 may be substantially co-planar with a top surface of the patterned mask 418p. The planarization process 424 may be a chemical mechanical polish (CMP) or an etch back process, or any other suitable process for planarizing the source contact 106 and the drain contact 108.

Figure 4L:
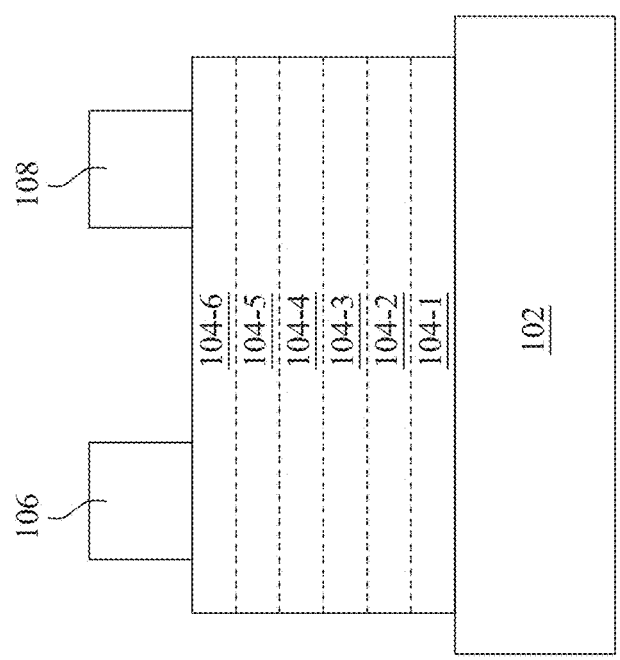

Thereafter, as shown in FIG. 4L, the patterned mask 418p may be removed. This may be achieved by a stripping process (e.g. a wet strip process) or an ashing process (e.g. plasma ashing process) that leaves the source contact 106 and the drain contact 108 substantially unperturbed. After this, the process flow may be continued to form a gate structure (e.g. a back-gate structure or a front-gate structure, not shown in the Figures). In the embodiment where a back-gate structure is formed, a gate stack comprising a gate electrode and a gate dielectric may be formed on the side of the carrier substrate 102 facing away from the first conductive layer 104. In another embodiment where a front-gate structure is formed, a gate stack comprising a gate electrode and a gate dielectric may be formed on the side of the carrier substrate 102 having the first conductive layer 104.

In summary, the method 300 shown in FIG. 3 may be used to form the first conductive layer 104 (e.g. having a plurality of sub-layers comprising a TMD material such as $MoS_2$) by repeating an epitaxial CVD growth process on the carrier substrate 102 (e.g. sapphire substrate). With film depth profiling using the SPM 404 (e.g. AFM), the mean thickness of the first conductive layer 104 following each iteration of the first deposition process 402 may be determined or calculated. The results shown in FIG. 5 indicate that the uniformity of the local thicknesses of the first conductive layer 104 is improved with each iteration of the first deposition process 402. The determined or calculated mean thickness may be used as a reliable parameter to estimate the actual thickness of the first conductive layer 104 and the number of sub-layers in the first conductive layer 104, as demonstrated by the HRTEM images shown in FIGS. 6A to 6C. Based on the determined or calculated mean thickness, a subsequent iteration of the first deposition process 402 may be performed in an effort to increase the mean thickness of the first conductive layer 104 and thereby increase the mobility of carriers in the first conductive layer 104.

Figure 7:
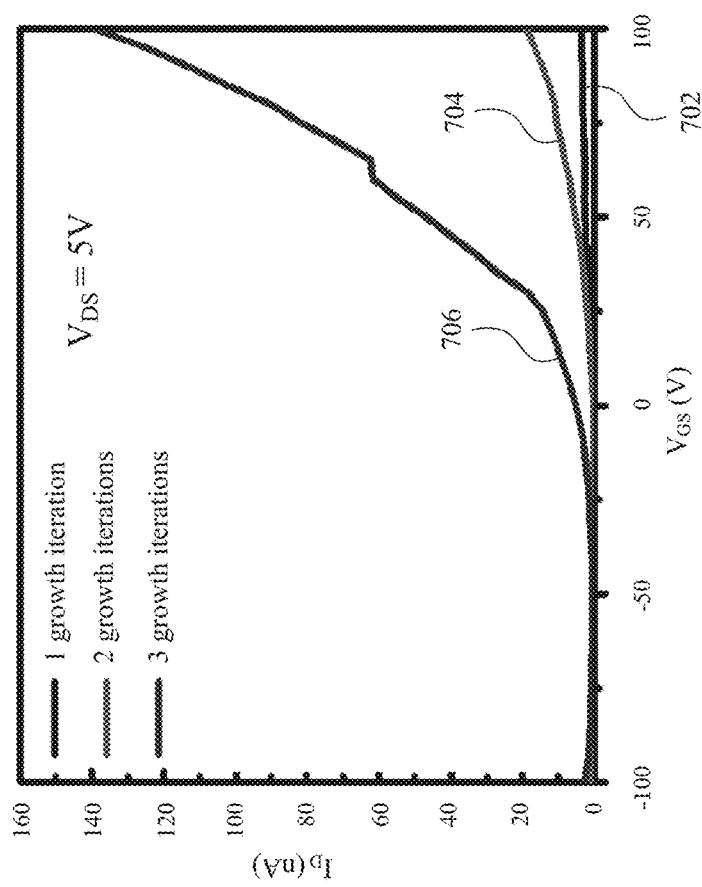
FIG. 7 shows current-voltage characteristics of various semiconductor devices, in accordance with some embodiments.

The correlation between the mobility of carriers in the first conductive layer 104 and the thickness of the first conductive layer 104 is demonstrated by the curves shown in FIG. 7. FIG. 7 shows current-voltage characteristics of various semiconductor devices having first conductive layers 104 of differing thicknesses. In the plots shown in FIG. 7, drain current $I_D$ is plotted against a potential difference $V_{GS}$ between the source contact 106 and a gate contact. In each of the curves shown, a potential difference $V_{DS}$ between the source contact 106 and the drain contact 108 was about 5 volts. Curve 702 shows the drain current for a semiconductor device where the first conductive layer 104 comprises two 2D material (e.g. $MoS_2$) sub-layers, formed using a single iteration of the first deposition process 402. Curve 704 shows the drain current for a semiconductor device where the first conductive layer 104 comprises four 2D material (e.g. $MoS_2$) sub-layers, formed using two iterations of the first deposition process 402. Curve 706 shows the drain current for a semiconductor device where the first conductive layer 104 comprises six 2D material (e.g. $MoS_2$) sub-layers, formed using three iterations of the first deposition process 402. As shown in FIG. 7, increasing the thickness of the first conductive layer 104 (e.g. by increasing the number of 2D material sub-layers of the first conductive layer 104) can increase the mobility of carriers in the first conductive layer 104.

FIG. 7 also indicates that the increase in drain current $I_D$ as the number of 2D material sub-layers in increased is also accompanied by an increase in ON/OFF ratios for the semiconductor devices. For example, the ON/OFF ratio for the device having two 2D material (e.g. $MoS_2$) sub-layers is about 20, while the ON/OFF ratio for the device having four 2D material (e.g. $MoS_2$) sub-layers is about 184, and the ON/OFF ratio for the device having six 2D material (e.g. $MoS_2$) sub-layers is about 350. Consequently, repeating the first deposition process 402 may provide desirable effects for practical application of transistors having 2D material sub-layers.

Although repeating the first deposition process 402 increases the mean thickness of the first conductive layer 104, the thickness of the first conductive layer 104 comprising six 2D material (e.g. $MoS_2$) sub-layers is still below about 5 nm, which indicates that the method 300 described above may be compatible with sub-10 nm node (e.g. 5 to 7 nm node) transistor fabrication. Furthermore, considering the requirements of sub-10 nm node (e.g. 5 to 7 nm node) transistor fabrication, it is estimated that about ten 2D material (e.g. $MoS_2$) sub-layers may be formed in the first conductive layer 104 such that a channel having a thickness in a range from about 5 nm to about 6 nm is possible.

In accordance with various embodiments described herein, a method of manufacturing a semiconductor device is provided. The method may include: epitaxially forming a first two-dimensional (2D) material layer over a substrate; calculating a mean thickness of the first 2D material layer; comparing the mean thickness of the first 2D material layer with a reference parameter; determining that the mean thickness of the first 2D material layer is not substantially equal to the reference parameter; and after the determining, epitaxially forming a second 2D material layer over the first 2D material layer.

In accordance with various embodiments described herein, a method of manufacturing a semiconductor device is provided. The method may include: forming a transition metal dichalcogenide (TMD)-containing layer over a carrier substrate using an epitaxial deposition process; calculating a mean thickness of the TMD-containing layer; and repeating the epitaxial deposition process while the mean thickness of the TMD-containing layer is less than a predetermined threshold.

In accordance with various embodiments described herein, a semiconductor device is provided. The semiconductor device may include: a substrate; a plurality of two-dimensional (2D) material layers disposed over the substrate, each of the 2D material layers comprising a one-molecule thick transition metal dichalcogenide (TMD) material layer; and a contact disposed on a portion of the plurality of 2D material layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    flowing a process gas over a substrate, the process gas comprising a transition metal and a chalcogenide;
    epitaxially forming a first two-dimensional (2D) material layer over the substrate;
    calculating a mean thickness of the first 2D material layer;
    comparing the mean thickness of the first 2D material layer with a reference parameter;
    determining whether the mean thickness of the first 2D material layer is less than the reference parameter;
    in response to determining that the mean thickness is less than the reference parameter, epitaxially forming a second 2D material layer over the first 2D material layer; and
    after forming the first 2D material layer, forming a gate stack comprising a gate dielectric layer and a gate electrode on a side of the substrate facing away from the first 2D material layer.

2. The method of claim 1, wherein the calculating the mean thickness of the first 2D material layer comprises generating a distribution of local thicknesses of the first 2D material layer taken along a lateral dimension of the first 2D material layer, and calculating the mean thickness of the first 2D material layer from the distribution of local thicknesses.

3. The method of claim 2, wherein the generating the distribution of local thicknesses of the first 2D material layer comprises scanning a major surface of the first 2D material layer with a probe tip of an atomic force microscope.

4. The method of claim 1, wherein the reference parameter comprises a desired thickness in a range from about 3.75 nm to about 4.25 nm.

5. The method of claim 1, wherein the first 2D material layer and the second 2D material layer comprise a transition metal dichalcogenide (TMD) material, and wherein the gate stack is formed after forming the second 2D material layer.

6. The method of claim 1, wherein the epitaxially forming the first 2D material layer comprises an epitaxial chemical vapor deposition process.

7. The method of claim 1, wherein the epitaxially forming the first 2D material layer comprises a metal catalyst-free chemical vapor deposition process.

8. The method of claim 1, wherein the substrate comprises a sapphire substrate.

9. The method of claim 1, wherein the first 2D material layer comprises one or more 2D material sub-layers.

10. A method, comprising:
    depositing a transition metal dichalcogenide (TMD)-containing layer over a carrier substrate using an expitaxial deposition process;
    calculating a mean thickness of the TMD-containing layer;
    repeating the epitaxial deposition process while the mean thickness of the TMD-containing layer is less than a predetermined threshold;
    after depositing the TMD-containing layer, forming a mask over the TMD-containing layer, the mask physically contacting a top surface and sidewalls of the TMD-containing layer, the mask comprising an opening exposing a portion of the top surface of the TMD-containing layer; and
    forming a contact in the opening.

11. The method of claim 10, wherein the epitaxial deposition process comprises flowing a carrier gas comprising nitrogen or argon, and flowing a process gas comprising at least one of sulfur, $MoCl2$, $MoCl5$, or $MoO3$.

12. The method of claim 10, wherein the epitaxial deposition process is performed at a temperature in a range from about 750 degrees Celsius to about 1000 degrees Celsius.

13. The method of claim 10, wherein the epitaxial deposition process is performed at a temperature in a range from about 600 degrees Celsius to about 700 degrees Celsius.

14. The method of claim 10, wherein the calculating the mean thickness of the TMD-containing layer comprises generating a thickness histogram of the TMD-containing layer, the thickness histogram comprising a distribution of local thicknesses of the TMD-containing layer.

15. The method of claim 10, wherein the predetermined threshold comprises a desired thickness in a range from about 3.75 nm to about 4.25 nm.

16. The method of claim 10, further comprising forming a gate structure on the top surface of the TMD-containing layer after forming the contact.

17. A method comprising:
    epitaxially growing a transition metal dichalcogenide (TMD)-containing layer over a carrier substrate using an epitaxial deposition process, wherein the epitaxial deposition process comprises flowing a process gas comprising sulfur and at least one of $MoCl2$ or $MoCl5$;
    calculating a mean thickness of the TMD-containing layer;
    determining whether the mean thickness is within a desired thickness range;
    epitaxially growing one or more additional TMD-containing layers on the TMD-containing layer until a cumulative mean thickness of the TMD-containing layer and the one or more additional TMD-containing layers is within the desired thickness range;
    forming a mask over the TMD-containing layer and the one or more additional TMD-containing layers, the mask physically contacting a top surface of the carrier substrate, sidewalls of the TMD-containing layer and the one or more additional TMD-containing layers, and a top surface of the one or more additional TMD-containing layers;
    patterning the mask to form openings in the mask exposing the top surface of the one or more additional TMD-containing layers; and
    forming a source contact and a drain contact in the openings.

18. The method of claim 17 further comprising calculating the cumulative mean thickness of the TMD-containing layer and the one or more additional TMD-containing layers after each of the one or more additional TMD-containing layers.

19. The method of claim 17, the calculating the mean thickness of the TMD-containing layer comprises generating a thickness histogram of the TMD-containing layer using a scanning probe microscope (SPM), wherein the thickness histogram comprises a distribution of local thicknesses of the TMD-containing layer.

20. The method of claim 17 further comprising controlling a process temperature, pressure, amount of precursor chemicals, or combination thereof during epitaxially growing the TMD-containing layer in accordance with a desired thickness of the TMD-containing layer.

* * * * *